United States Patent
Kuo et al.

(10) Patent No.: US 10,778,200 B2
(45) Date of Patent: Sep. 15, 2020

(54) WIDE-BAND 360 DEGREE PHASE SHIFTER UTILIZING RIGHT-HAND AND LEFT-HAND TRANSMISSION LINE SWITCHES FOR RF COMMUNICATIONS

(71) Applicant: Swiftlink Technologies Inc., Richmond OT (CA)

(72) Inventors: Che-Chun Kuo, Atlanta, GA (US); Taiyun Chi, Atlanta, GA (US); Thomas Chen, Atlanta, GA (US)

(73) Assignee: SWIFTLINK TECHNOLOGIES INC., Richmond (CA)

( * ) Notice: Subject to any disclaimer, the term of this patent is extended or adjusted under 35 U.S.C. 154(b) by 0 days.

(21) Appl. No.: 15/989,156

(22) Filed: May 24, 2018

(65) Prior Publication Data
US 2019/0363702 A1  Nov. 28, 2019

(51) Int. Cl.
*H03K 5/00* (2006.01)
*H04B 1/00* (2006.01)
*H03F 3/195* (2006.01)
*H03G 3/30* (2006.01)

(52) U.S. Cl.
CPC ............... *H03K 5/00* (2013.01); *H03F 3/195* (2013.01); *H03G 3/3036* (2013.01); *H04B 1/0082* (2013.01); *H03F 2200/336* (2013.01); *H03F 2200/451* (2013.01); *H03G 2201/307* (2013.01); *H03K 2005/00286* (2013.01)

(58) Field of Classification Search
CPC ...................... H04L 2027/0057; H04B 1/0082
See application file for complete search history.

(56) References Cited

U.S. PATENT DOCUMENTS

| | | | | |
|---|---|---|---|---|
| 4,605,912 A | * | 8/1986 | Naster | H01P 1/185 257/275 |
| 2004/0214537 A1 | * | 10/2004 | Bargroff | H03D 7/1425 455/136 |
| 2007/0159259 A1 | * | 7/2007 | Suh | H03B 21/02 331/2 |
| 2007/0160168 A1 | * | 7/2007 | Beukema | H04L 27/0014 375/326 |

* cited by examiner

*Primary Examiner* — Hsinchun Liao
(74) *Attorney, Agent, or Firm* — Womble Bond Dickinson (US) LLP

(57) ABSTRACT

An RF frontend IC device includes an RF transceiver to transmit and receive RF signals and a frequency synthesizer to perform frequency synthetization to operate within a predetermined frequency band. The frequency synthesizer generates an LO signal to the RF transceiver to enable the RF transceiver to transmit and receive RF signals within the predetermined frequency band. The frequency synthesizer includes a QPG circuit to generate signals shifted in phases based on the LO signal and a phase shifting circuit to generate quadrant signals based on the signals shifted in phases. Each of the quadrant signals corresponds to one of the four quadrants in phases in the respective quadrant spaces. The phase shifting circuit includes multiple phase switches operable in a collaboration manner to further shift in phase based on the signal shifted in phases to generate the quadrant signals in proper quadrant spaces.

20 Claims, 13 Drawing Sheets

WIDE-BAND 360 DEGREE PHASE SHIFTER UTILIZING RIGHT-HAND AND LEFT-HAND TRANSMISSION LINE SWITCHES FOR RF COMMUNICATIONS

FIELD OF THE INVENTION

Embodiments of the present invention relate generally to quadrature phase generation circuit for radio frequency (RF) circuit. More particularly, embodiments of the invention relate to wide-band phase shifter using right-hand and left-hand transmission line switches for RF communications.

BACKGROUND

International Telecommunication Unit (ITU) is doing a research for possible band between 24.25 to 43.5 GHz for 5G frequency band and therefore wide band as 24 to 43.5 GHz has become significant for 5G development.

Quadrature signals have been used wildly for frontend circuit, for instance, a frequency modulator, a phase shifter etc. Traditional quarter wavelength coupled transmission line as known as Lange coupler can generates quadrature signals with low insertion loss and good return loss simultaneously. However, the coupled line needs large chip size which is not suitable for consumer electronic device design. Phase shifter is widely used for phase array system. However, there has been a lack of efficient and compact phase shifters in the market.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
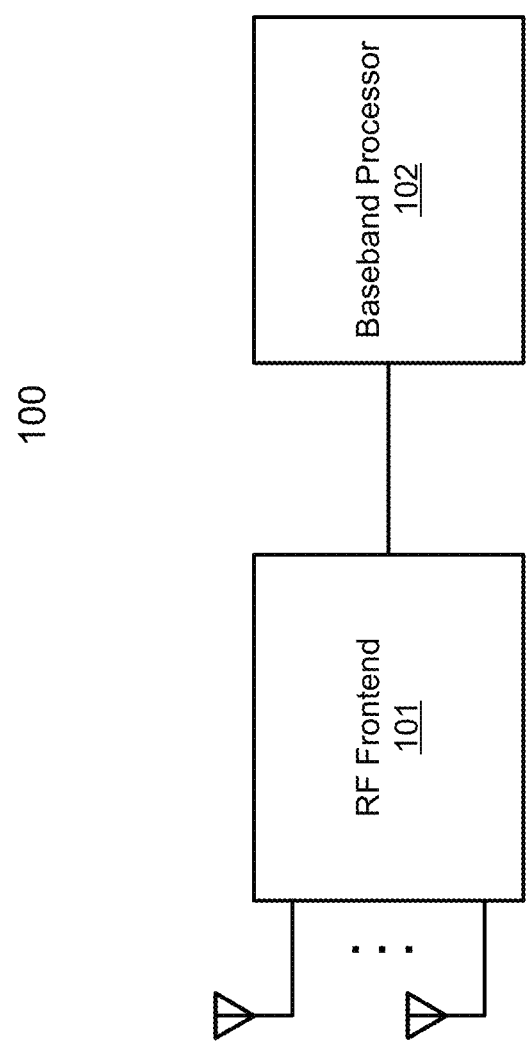
FIG. 1 is a block diagram illustrating an example of a wireless communication device according one embodiment of the invention.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

According to some embodiments, an RF frontend IC device includes an RF transceiver to transmit and receive RF signals and a frequency synthesizer to perform frequency synthetization to operate within a predetermined frequency band. The frequency synthesizer generates a local oscillator (LO) signal to the RF transceiver to enable the RF transceiver to transmit and receive RF signals within the predetermined frequency band. The frequency synthesizer includes a quadrature phase generator (QPG) circuit to generate signals shifted in phases based on the LO signal and a phase shifting circuit to generate quadrant signals based on the signals shifted in phases. Each of the quadrant signals corresponds to one of the four quadrants in phases in the respective quadrant spaces. The phase shifting circuit includes multiple phase switches operable in a collaboration manner to further shift in phase based on the signal shifted in phases generated by the QPG circuit to generate the quadrant signals in proper quadrant spaces.

According to one embodiment, the phase shifting circuit includes one or more variable gain amplifiers and one or more phase shifting logic. A variable gain amplifier is coupled to the QPG circuit to amplify the signals with different gains. Phase shifting logic is coupled to the variable gain amplifier to switch in different degrees in phases to generate the quadrant signals. The QPG circuit generates a first signal shifted in a first degree (e.g., −45 degrees) and a second signal shifted in a second degree (e.g., +45 degrees).

In one embodiment, the variable gain amplifiers include a first variable gain amplifier to amplify the first signal and a second variable gain amplifier to amplify the second signal generated from the QPG circuit. The phase shifting logic includes a first phase switch and a second phase switch coupled to the first and second variable gain amplifiers respectively. In one embodiment, the phase shifting logic further includes a power combiner logic coupled to the first phase switch and the second phase switch to combine outputs of the first and second phase switches to generate the quadrant signals.

In one embodiment, each of the phase switches can switch in a zero degree and 180 degrees when positioned in different positions (e.g., on or off position). When both the first and second phase switches are configured with zero degree, the quadrant signals generated are in the first quadrant space (e.g., between zero degree and 90 degrees). When the first phase switch is configured at the zero degree and the second phase switch is configured at the 180 degrees, the quadrant signals generated are in the second quadrant space (e.g., between 90 degrees and 180 degrees). When both the first and second phase switches are configured at 180 degrees, the quadrant signals generated are in the third quadrant space (e.g., between 180 degrees and 270 degrees).

When the first phase switch is configured at 180 degrees and the second phase switch is configured at zero degree, the quadrant signals generated are the fourth quadrant space (e.g., between 270 degrees and 360 degrees). In one embodiment, by adjusting the gains of the variable gain amplifiers, an amplitude and phase angle of a corresponding quadrant signal can be adjusted within its corresponding quadrant space.

FIG. 1 is a block diagram illustrating an example of a wireless communication device according one embodiment of the invention. Referring to FIG. 1, wireless communication device 100 (also simply referred to as a wireless device) includes, amongst others, an RF frontend module 101 and a baseband processor 102. Wireless device 100 can be any kind of wireless communication devices such as, for example, mobile phones, laptops, tablets, network appliance devices (e.g., Internet of thing or TOT appliance devices), etc. Wireless communication device 100 may be a CPE device.

In a radio receiver circuit, the RF frontend is a generic term for all the circuitry between the antenna up to and including the mixer stage. It consists of all the components in the receiver that process the signal at the original incoming radio frequency, before it is converted to a lower intermediate frequency (IF). In microwave and satellite receivers it is often called the low-noise block (LNB) or low-noise down-converter (LND) and is often located at the antenna, so that the signal from the antenna can be transferred to the rest of the receiver at the more easily handled intermediate frequency. A baseband processor is a device (a chip or part of a chip) in a network interface that manages all the radio functions (all functions that require an antenna).

In one embodiment, RF frontend module 101 includes an array of RF transceivers, where each of the RF transceivers transmits and receives RF signals within a particular frequency band (e.g., a particular range of frequencies such as non-overlapped frequency ranges) via one of a number of RF antennas. The RF frontend integrated circuit (IC) chip further includes a full-band frequency synthesizer coupled to the RF transceivers. The full-based frequency synthesizer generates and provides a local oscillator (LO) signal to each of the RF transceivers to enable the RF transceiver to mix, modulate, and/or demodulate RF signals within a corresponding frequency band. The array of RF transceivers and the full-band frequency synthesizer may be integrated within a single IC chip as a single RF frontend IC chip or package.

Figure 2:
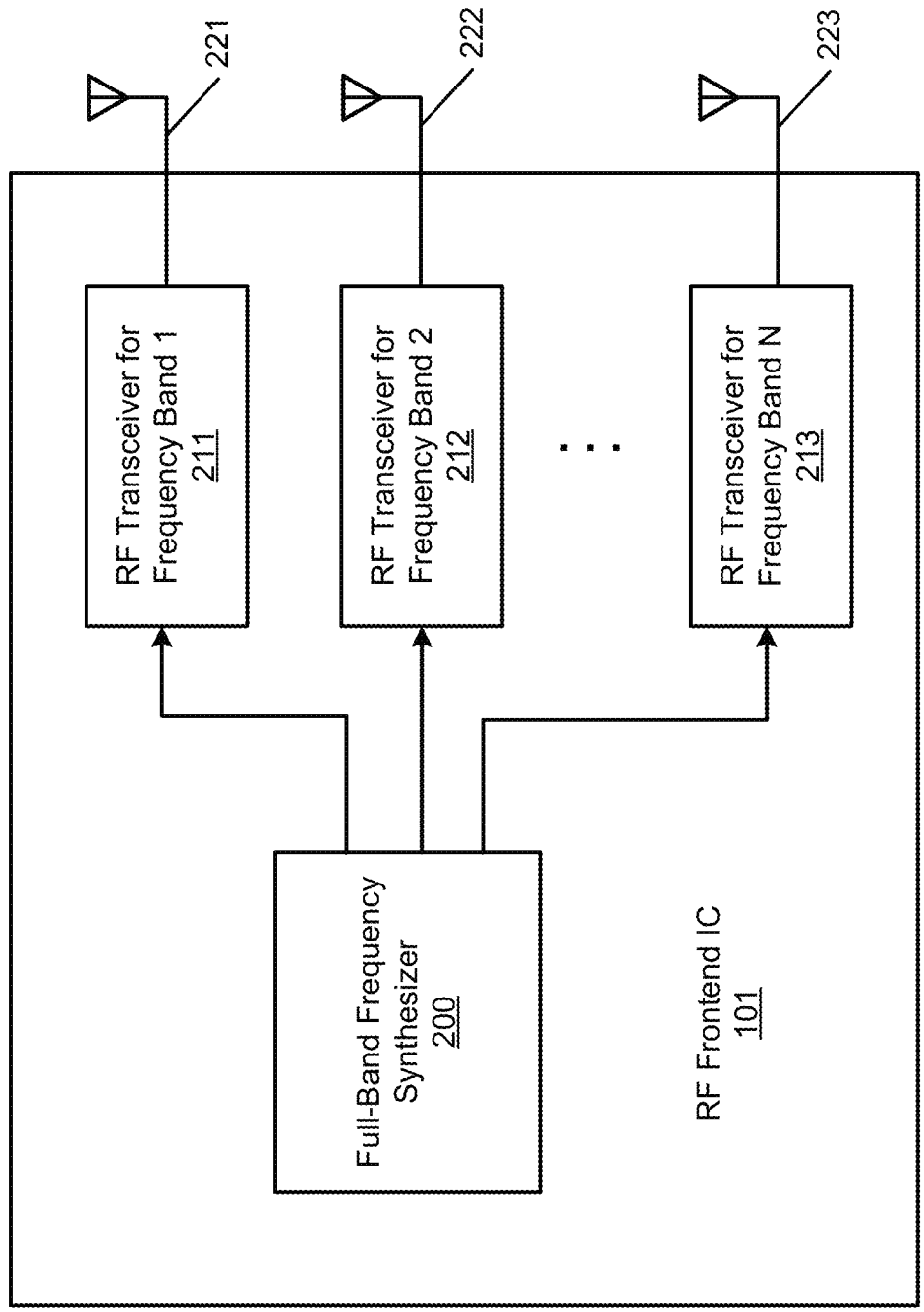
FIG. 2 is a block diagram illustrating an example of an RF frontend integrated circuit according to one embodiment of the invention.

FIG. 2 is a block diagram illustrating an example of an RF frontend integrated circuit according to one embodiment of the invention. Referring to FIG. 2, RF frontend 101 includes, amongst others, a full-base frequency synthesizer 200 coupled to an array of RF transceivers 211-213. Each of transceivers 211-213 is configured to transmit and receive RF signals within a particular frequency band or a particular range of RF frequencies via one of RF antennas 221-223. In one embodiment, each of transceivers 211-213 is configured to receive a LO signal from full-band frequency synthesizer 200. The LO signal is generated for the corresponding frequency band. The LO signal is utilized to mix, modulate, demodulated by the transceiver for the purpose of transmitting and receiving RF signals within the corresponding frequency band.

Figure 3:
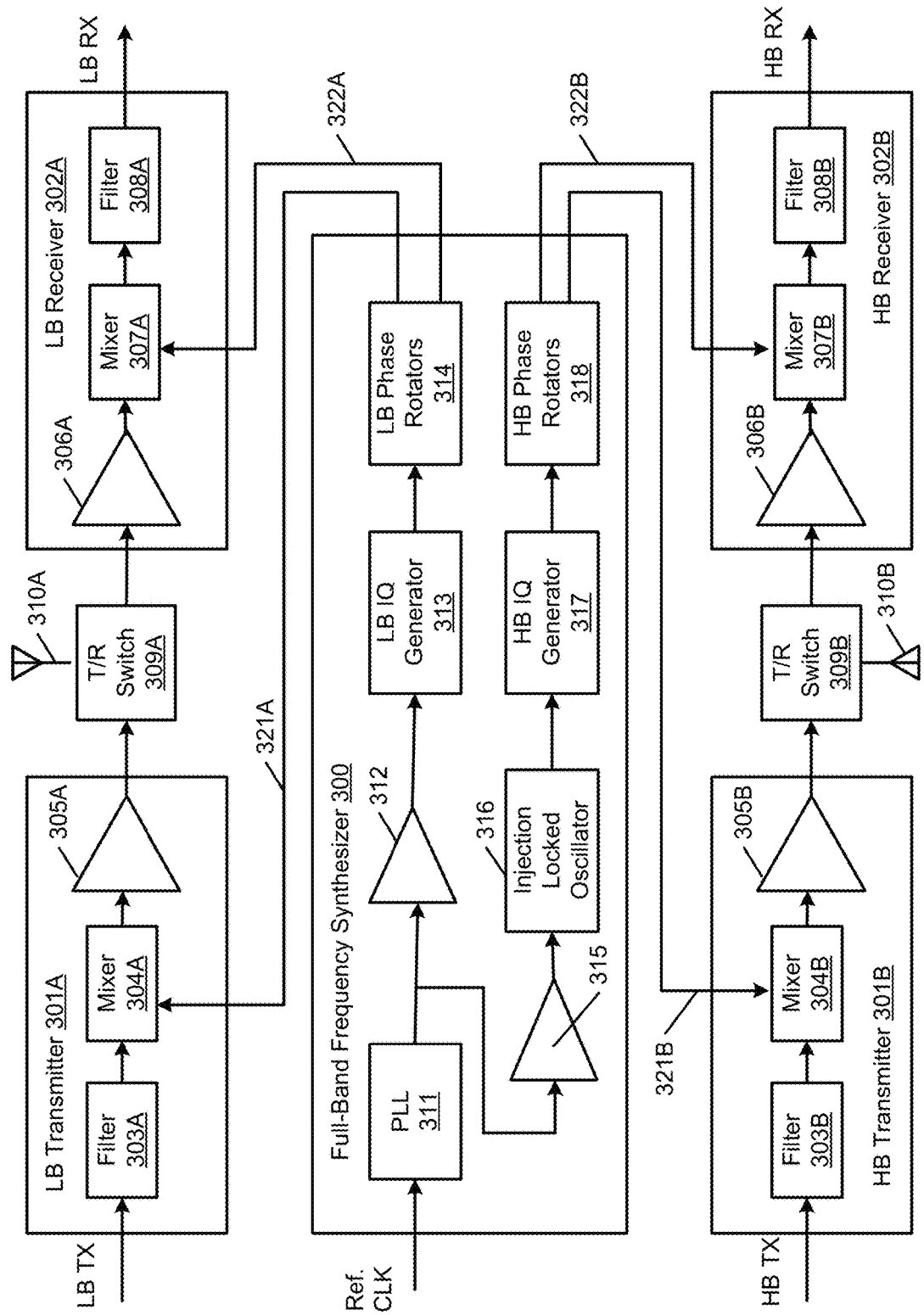
FIG. 3 is a block diagram illustrating an RF frontend integrated circuit according to another embodiment of the invention.

FIG. 3 is a block diagram illustrating an RF frontend integrated circuit according to another embodiment of the invention. Referring to FIG. 3, full-band frequency synthesizer 300 may represent full-band frequency synthesizer 101 as described above. In one embodiment, full-band frequency synthesizer 300 is communicatively coupled to an array of transceivers, each transceiver corresponding to one of a number of frequency bands. In this example, full-band frequency synthesizer 300 is coupled to transmitter 301A, receiver 302A, transmitter 301B, and receiver 302B. Transmitter 301A and receiver 302A may be a part of a first transceiver operating in a lower frequency band, referred to as a low-band (LB) transmitter and LB receiver. Transmitter 301B and receiver 302B may be a part of a second transceiver operating in a higher frequency band, referred to as a high-band (HB) transmitter and HB receiver. Note that although there are only two transceivers as shown in FIG. 3, more transceivers may also be coupled to full-band frequency synthesizer 300 as shown in FIG. 2.

In one embodiment, frequency synthesizer 300 includes, but is not limited to, phase-lock loop (PLL) circuitry or block 311, a LO buffer 312, LB in-phase/quadrature (IQ) generator 313, and LB phase rotators 314. A PLL is a control system that generates an output signal whose phase is related to the phase of an input signal. While there are several differing types, it is easy to initially visualize as an electronic circuit consisting of a variable frequency oscillator and a phase detector. The oscillator generates a periodic signal, and the phase detector compares the phase of that signal with the phase of the input periodic signal, adjusting the oscillator to keep the phases matched. Bringing the output signal back toward the input signal for comparison is called a feedback loop since the output is "fed back" toward the input forming a loop.

Keeping the input and output phase in lock step also implies keeping the input and output frequencies the same. Consequently, in addition to synchronizing signals, a phase-locked loop can track an input frequency, or it can generate a frequency that is a multiple of the input frequency. These properties are used for computer clock synchronization, demodulation, and frequency synthesis. Phase-locked loops are widely employed in radio, telecommunications, computers and other electronic applications. They can be used to demodulate a signal, recover a signal from a noisy communication channel, generate a stable frequency at multiples of an input frequency (frequency synthesis), or distribute precisely timed clock pulses in digital logic circuits such as microprocessors.

Referring back to FIG. 3, PLL block 311 is to receive a clock reference signal and to lock onto the frequency of the clock reference signal to generate a first LO signal, i.e., a low-band LO signal or LBLO signal. The first LO signal may be optionally buffered by a LO buffer 312. Based on the LBLO signal, LB IQ generator 313 generates IQ signals that are suitable for mixing, modulating, and demodulating in-phase and quadrature components of RF signals. The IQ signals may be rotated by a predetermined angle or delayed by LB phase rotators 314. The rotated IQ signals are then provided to LB transmitter 301A and receiver 302A. Particularly, the IQ signals may include transmitting IQ (TXIQ) signals 321A to be provided to LB transmitter 301A and in-phase and quadrature receiving IQ (RXIQ) signals 322A to be provided to LB receiver 302A.

In one embodiment, frequency synthesizer 300 further includes a frequency converter 315, injection locked oscillator 316, HB IQ generator 317, and HB phase rotators 318. Frequency converter 315 is to convert the first LO signal generated from the PLL block 311 to a signal with higher frequency (e.g., within a higher frequency band). In one embodiment, frequency converter 315 includes a frequency doubler to double the frequency of the first LO signal. Injection locked oscillator 316 is to lock onto the doubled-frequency signal received from frequency converter 315 to generator the second LO signal having the second LO frequency approximately twice as the first LO frequency. Note that in this example, the second LO frequency is twice as the first LO frequency. However, frequency converter 315 can convert and generate a frequency in any frequency range. If there are more frequency bands to be integrated within the RF frontend device, more frequency converters may be utilized to convert a reference frequency to a number of other lower or higher frequencies.

Injection locking and injection pulling are the frequency effects that can occur when a harmonic oscillator is disturbed by a second oscillator operating at a nearby frequency. When the coupling is strong enough and the frequencies near enough, the second oscillator can capture the first oscillator, causing it to have essentially identical frequency as the second. This is injection locking. When the second oscillator merely disturbs the first but does not capture it, the effect is called injection pulling. Injection locking and pulling effects are observed in numerous types of physical systems, however the terms are most often associated with electronic oscillators or laser resonators.

Referring back to FIG. 3, HB IQ generator 317 generates IQ signals that are suitable for mixing, modulating, and demodulating in-phase and quadrature components of RF signals in a high band frequency range. In electrical engineering, a sinusoid with angle modulation can be decomposed into, or synthesized from, two amplitude-modulated sinusoids that are offset in phase by one-quarter cycle ($\pi/2$ radians). All three functions have the same frequency. The amplitude modulated sinusoids are known as in-phase and quadrature components. Some people find it more convenient to refer to only the amplitude modulation (baseband) itself by those terms.

The IQ signals may be rotated by a predetermined angle or delayed by HB phase rotators 318. The rotated IQ signals are then provided to HB transmitter 301B and receiver 302B. Particularly, the IQ signals may include transmitting IQ (TXIQ) signals 321B to be provided to HB transmitter 301B and in-phase and quadrature receiving IQ (RXIQ) signals 322B to be provided to HB receiver 302B. Thus, components 312-314 are configured to generate TXIQ and RXIQ signals for LB transmitter 301A and LB receiver 302A, while components 315-318 are configured to generate TXIQ and RXIQ signals for HB transmitter 301B and HB receiver 302B. If there are more transmitters and receivers of more frequency bands involved, more sets of components 312-314 and/or components 315-318 may be maintained by frequency synthesizer 300 for generating the necessary TXIQ and RXIQ signals for the additional frequency bands.

In one embodiment, LB transmitter 301A includes a filter 303A, a mixer 304A, and an amplifier 305A. Filter 303A may be a low-pass (LP) filter that receives LB transmitting (LBTX) signals to be transmitted to a destination, where the LBTX signals may be provided from a baseband processor such as baseband processor 102. Mixer 301A (also referred to as an up-convert mixer or an LB up-convert mixer)) is configured to mix and modulate the LBTX signals onto a carrier frequency signal based on TXIQ signal provided by LB phase rotators 314. The modulated signals (e.g., low-band RF or LBRF signals) are then amplified by amplifier 305A and the amplified signals are then transmitted to a remote receiver via antenna 310A.

In one embodiment, LB receiver 302A includes an amplifier 306A, mixer 307A, and filter 308A. Amplifier 306A is to receive LBRF signals from a remote transmitter via antenna 310A and to amplify the received RF signals. The amplified RF signals are then demodulated by mixer 307A (also referred to as a down-convert mixer or an LB down-convert mixer) based on RXIQ signal received from LB phase rotators 314. The demodulated signals are then processed by filter 308A, which may be a low-pass filter. In one embodiment, LB transmitter 301A and LB receiver 302A share antenna 310A via a transmitting and receiving (T/R) switch 309A. T/R switch 309A is configured to switch between LB transmitter 301A and receiver 302A to couple antenna 310A to either LB transmitter 301A or LB receiver 302A at a particular point in time.

Similarly, HB transmitter 301B includes filter 303B, mixer 304B (also referred to as a HB up-convert mixer), and amplifier 305B having functionalities similar to filter 303A, mixer 304A, and amplifier 305A of LB transmitter 301A, respectively, for processing high-band transmitting (HBTX) signals. HB receiver 302B includes filter 306B, mixer 307B (also referred to as a HB down-convert mixer), and filter 308B having functionalities similar to amplifier 306A, mixer 307A, and filter 308A of LB receiver 302A, respectively, for processing high-band receiving (HBRX) signals. HB transmitter 301B and HB receiver 302B are coupled to antenna 310B via T/R switch 309B similar to the configuration of LB transmitter 301A and receiver 302A. Antenna 310A-310B may represent any one or more of antennas 221-223 of FIG. 2, which are not part of the RF frontend circuit.

Figure 4:
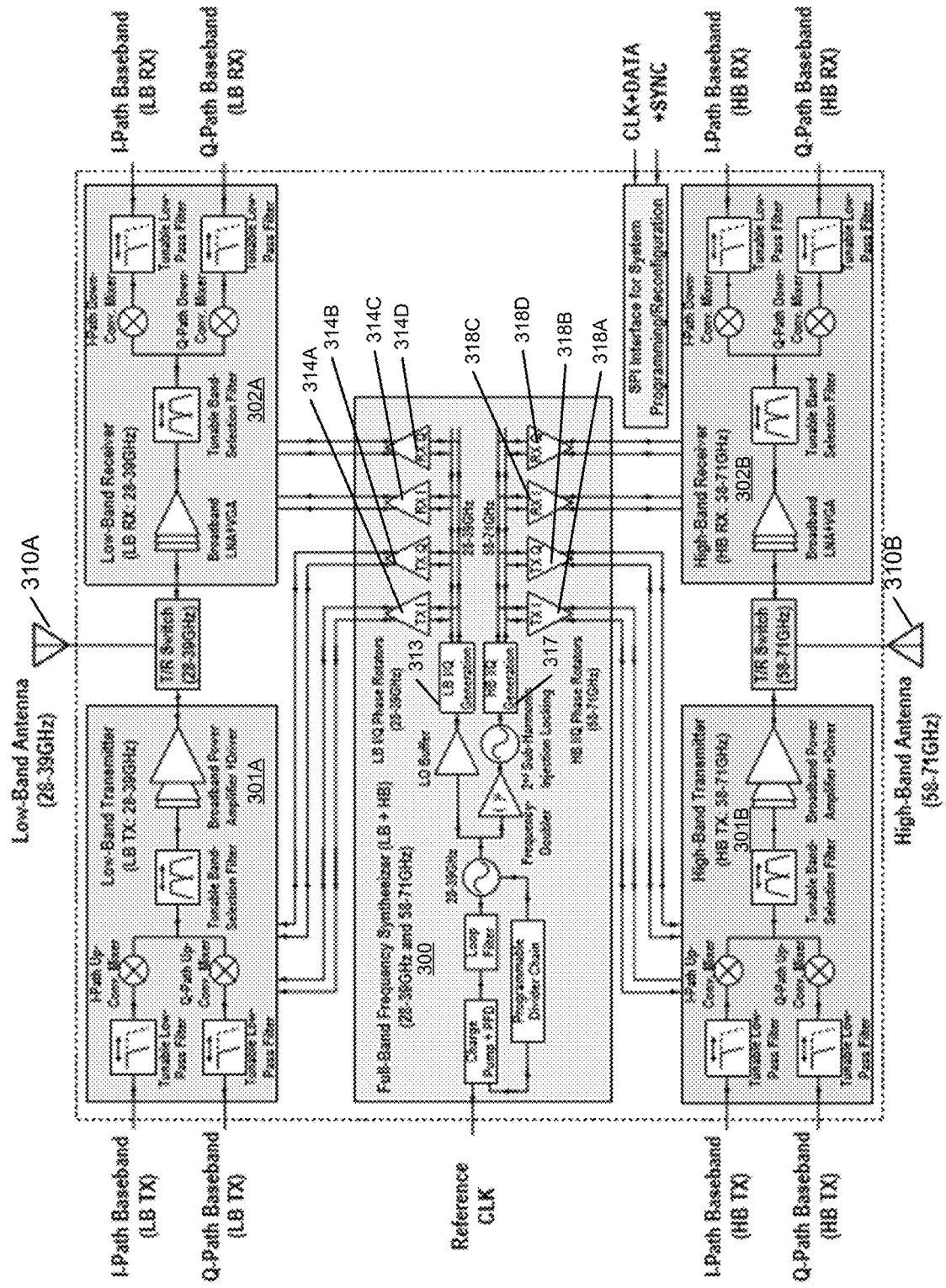
FIG. 4 is a block diagram illustrating an RF frontend integrated circuit according to another embodiment of the invention.

FIG. 4 is a block diagram illustrating an example of an RF frontend integrated circuit according to another embodiment of the invention. Referring to FIG. 4, in this embodiment, each of LB transmitter 301A, LB receiver 302A, HB transmitter 301B, and HB receiver 302B includes two paths: 1) I path for processing in-phase component signals and 2) Q-path for processing quadrature component signals. In one embodiment, LB transmitter 301A includes an I-path low-pass filter (e.g., a tunable low-pass filter) to receive I-path baseband signals and an I-path up-convert mixer to mix and modulate the I-path baseband signals. LB transmitter 301A includes a Q-path low pass filter (e.g., a tunable low-pass filter) to receive Q-path baseband signals and a Q-path up-convert mixer to mix and modulate the Q-path baseband signals. LB transmitter 301A further includes a tunable band selection filter and an amplifier. The band selection filter (e.g., a band-pass filter) is to select the corresponding frequency band to remove noises that are outside of the corresponding band. The amplifier is to amplify the modulated RF signals to be transmitted to a remote device via antenna 310A. HB transmitter 301B includes similar components as of LB transmitter 301A for processing signals in a higher frequency band.

Similarly, according to one embodiment, LB receiver 302A includes an amplifier (e.g., a low-noise amplifier or LNA) to receive LBRF signals from a remote device via antenna 310A and a band selection filter (e.g., a band-pass filter). LB receiver 302A further includes an I-path down-convert mixer and a Q-path down-convert mixer to mix and demodulate the RF signal into I-path baseband signals and Q-path baseband signals. LB receiver 302A further includes an I-path low-pass filter and a Q-path low-pass filter to processing the I-path baseband signals and the Q-path baseband signals, which can then be provided to the baseband processor. HB receiver 302B includes similar components as of LB receiver 302A for processing signals in a higher frequency band.

In one embodiment, frequency synthesizer 300 includes a PLL block having a charge pump with a phase frequency detector, a loop filter, a programmable divider, a voltage-controlled oscillator. The frequency synthesizer 300 further includes a frequency doubler and an injection locking oscillator as described above with respect to FIG. 3.

In addition, frequency synthesizer 300 includes in-phase transmitting (TXI) phase rotator 314A, quadrature transmitting (TXQ) phase rotator 314B, in-phase receiving (RXI) phase rotator 314C, and quadrature receiving (RXQ) phase rotator 314D, which are specifically configured to perform phase rotation to generate in-phase LO signals and quadrature LO signals for LB transmitter 301A and LB receiver 302A. Specifically, TXI phase rotator 314A is coupled to the I-path up-convert mixer of LB transmitter 301A and TXQ phase rotator 314B is coupled to the Q-path up-convert mixer of LB transmitter 301A to enable the I-path and Q-path baseband signals to be mixed and modulated within the corresponding frequency band. RXI phase rotator 314C is coupled to the I-path down-convert mixer of LB receiver 302A and RXQ phase rotator 314D is coupled to the Q-path down-convert mixer of LB receiver 302A to enable the I-path and Q-path baseband signals to be mixed and demodulated within the corresponding frequency band.

In one embodiment, frequency synthesizer 300 includes in-phase transmitting (TXI) phase rotator 318A, quadrature transmitting (TXQ) phase rotator 318B, in-phase receiving (RXI) phase rotator 318C, and quadrature receiving (RXQ) phase rotator 318D, which are specifically configured to perform phase rotation to generate in-phase LO signals and quadrature LO signals for HB transmitter 301B and HB receiver 302B. Specifically, TXI phase rotator 318A is coupled to the I-path up-convert mixer of HB transmitter 301B and TXQ phase rotator 318B is coupled to the Q-path up-convert mixer of HB transmitter 301B to enable the I-path and Q-path baseband signals to be mixed and modulated within the corresponding frequency band. RXI phase rotator 318C is coupled to the I-path down-convert mixer of HB receiver 302A and RXQ phase rotator 318D is coupled to the Q-path down-convert mixer of HB receiver 302B to enable the I-path and Q-path baseband signals to be mixed and demodulated within the corresponding frequency band.

Again, in this example as shown in FIG. 4, there are two frequency bands covered by the frequency synthesizer 300. However, more frequency bands may be implemented within the integrated RF frontend. If there are more frequency bands to be implemented, more sets of TXI, TXQ, RXI, and RXQ phase rotators may be required.

Figure 5:
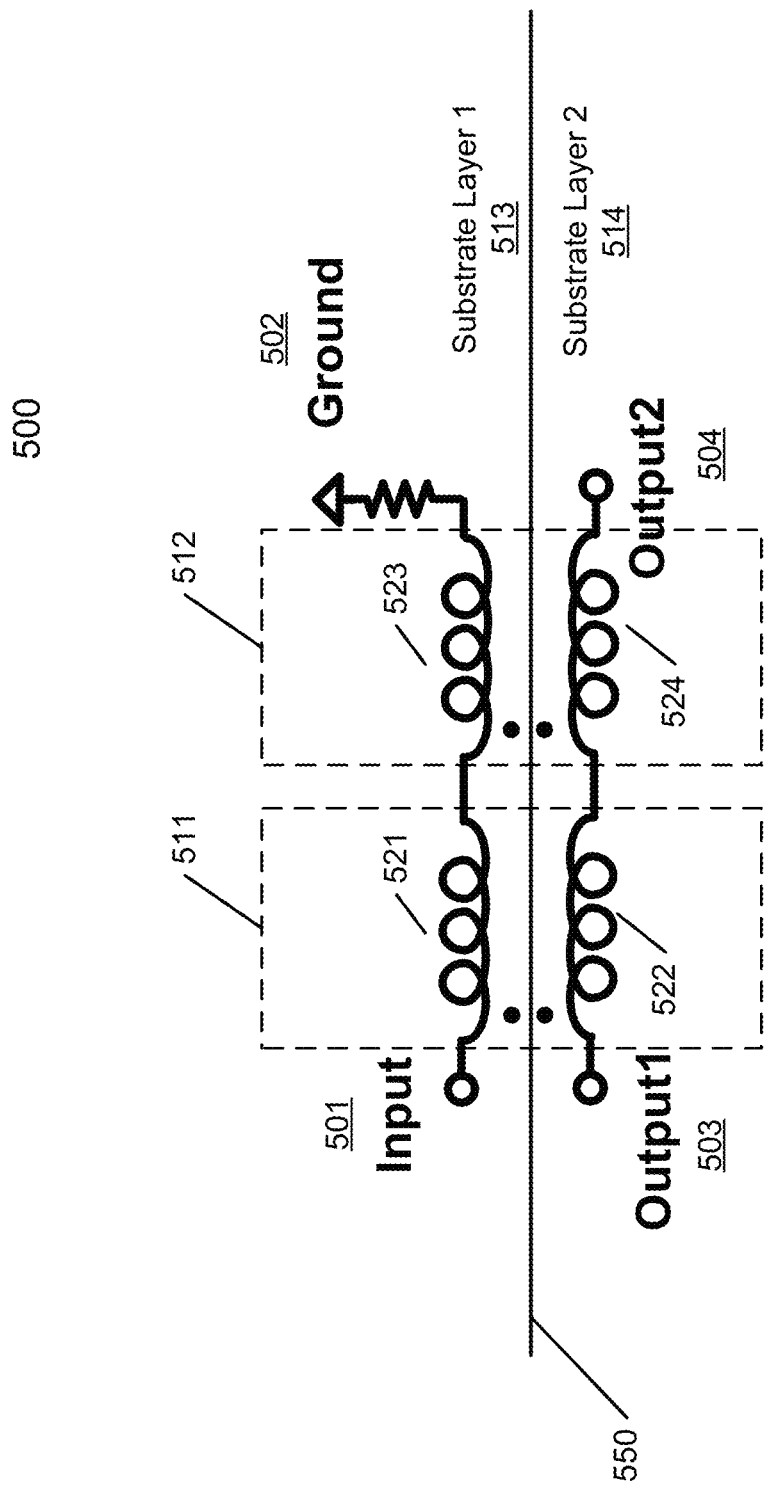
FIG. 5 shows an example of a quadrature phase generator circuit according to one embodiment of then invention.

FIG. 5 is a block diagram illustrating a transformer-based quadrature signal generator according to one embodiment of the invention. The quadrature signal generator 500, also referred to as QPG generator, may be implemented as a part of IQ generators 313 and 317 and/or phase rotators 314 and 318 of FIG. 3. Referring to FIG. 5, in this embodiment, QPG generator 500 includes a first transformer 511 and a second transformer 512 coupled to each other in series, forming an input terminal 501, a ground terminal 502 via a termination resistor (e.g., 50 ohms), a first output terminal 503, and a second output terminal 504. In one embodiment, QPG generator 500 receives a LO signal from input terminal 501, produces a first quadrature signal in a first phase shift or delay such as +45 degrees in phase shift at output terminal 503, and produces a second quadrature signal in a second phase shift or delay such as −45 degrees in phase shift at output terminal 504.

In one embodiment, transformers 511-512 are implemented as a part of CMOS process. In one embodiment, a primary winding (e.g., a first winding) and a secondary winding (e.g., a second winding) of each transformer is disposed on different substrate layers of the IC. In this example, first or primary winding 521 of transformer 511 is disposed on substrate layer 513 while second or secondary winding 522 of transformer 511 is disposed on substrate layer 514. Winding 521 and winding 522 are disposed on the opposite sides of dielectric material 550. Similarly, first or primary winding 523 of transformer 512 is disposed on substrate layer 513 while second or secondary winding 524 of transformer 512 is disposed on substrate layer 514. Winding 523 and winding 524 are disposed on the opposite sides of dielectric material 550. Winding 521 is connected with winding 523 in series, while winding 522 is connected with winding 524 in series.

In one embodiment, the windings of a transformer are implemented using a set of electrically conductive traces or microstrips disposed on a substrate layer in a spiral shape. The spiral shape can be in a rectangular spiral shape, other shapes such as circular, ellipse, or square spiral shapes may also be applicable. In one embodiment, a first set of electrically conductive traces representing the primary winding 521 of transformer 511 is disposed on the first substrate layer of an IC such as substrate layer 513. A second set of electrically conductive traces representing the secondary winding 522 of transformer 511 is disposed on the second substrate layer of the IC such as substrate layer 514. Input terminal 501 is coupled to the center tab of the electrically conductive traces of the first set on the first substrate layer. The first output terminal 503 is coupled to the center tab of the electrically conductive traces of the second set on the second substrate layer.

Similarly, a first set of electrically conductive traces representing the primary winding 523 of transformer 512 is disposed on the first substrate layer of an IC such as substrate layer 513. A second set of electrically conductive traces representing the secondary winding 524 of transformer 512 is disposed on the second substrate layer of the IC such as substrate layer 514. Ground terminal 502 is coupled to the center tab of the electrically conductive traces of the first set via a termination resistor 530 (e.g., 50 ohms) on the first substrate layer. The second output terminal 504 is coupled to the center tab of the electrically conductive traces of the second set on the second substrate layer. A terminal end of the outer ring of the electrically conductive traces of first transformer 511 is coupled to a terminal end of the outer ring of the electrically conductive traces of second transformer 512 on the same substrate layer, such that transformer 511 is coupled in series with transformer 512. In one embodiment, the length of the electrically conductive trace forming a spiral shape of each winding is approximately equal to a quarter of a wavelength associated with an operating frequency of the QPG generator. The space between two electrically conductive traces (or tracks, wires, or strips) desires to be as close as possible.

Figure 6A:
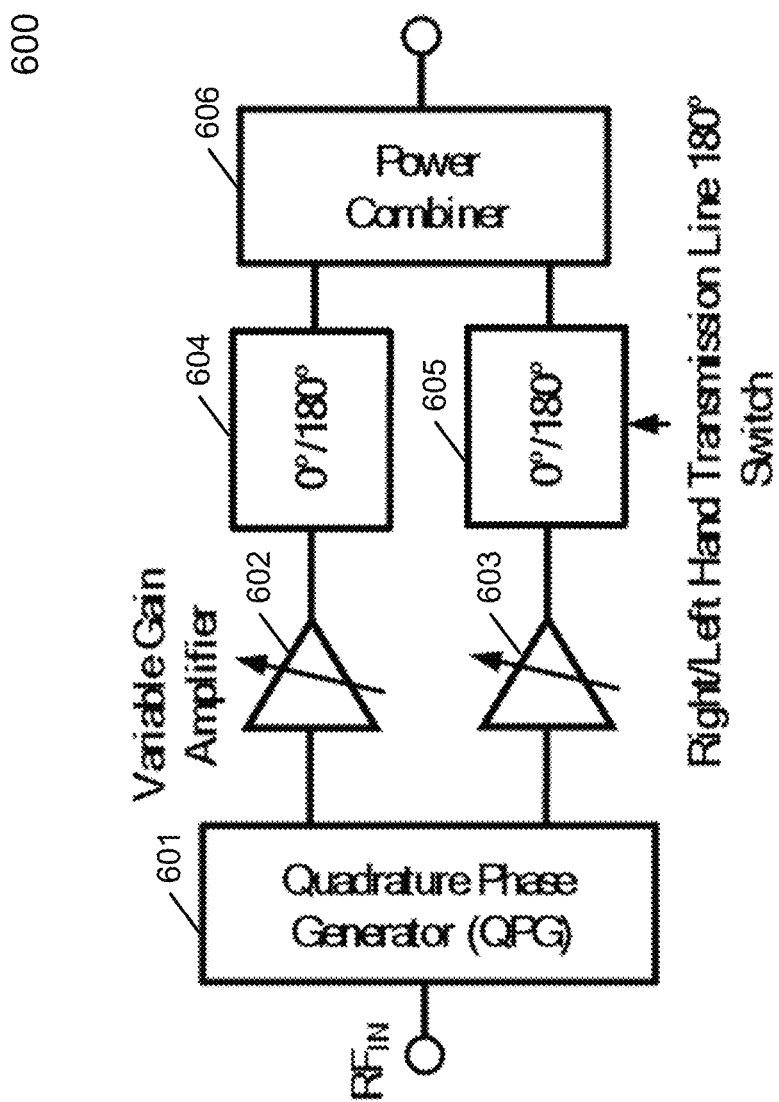
FIGS. 6A-6C show an example of phase shifting circuit according to one embodiment of the invention.
Figure 6B:
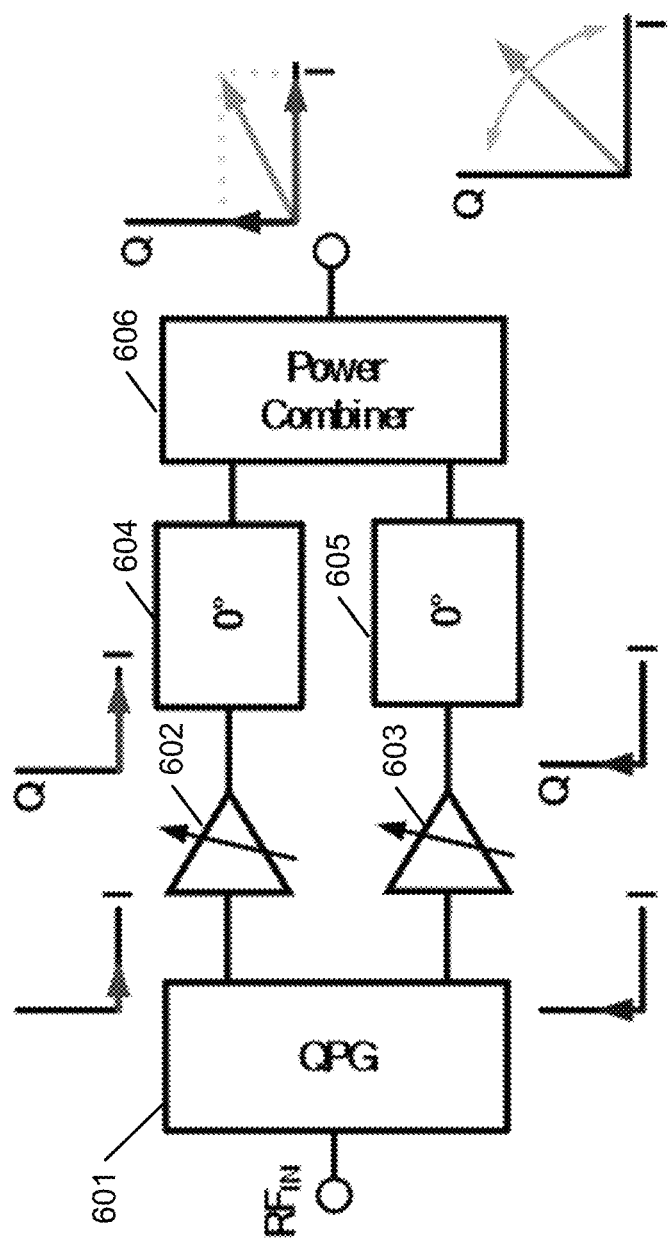
Figure 6C:
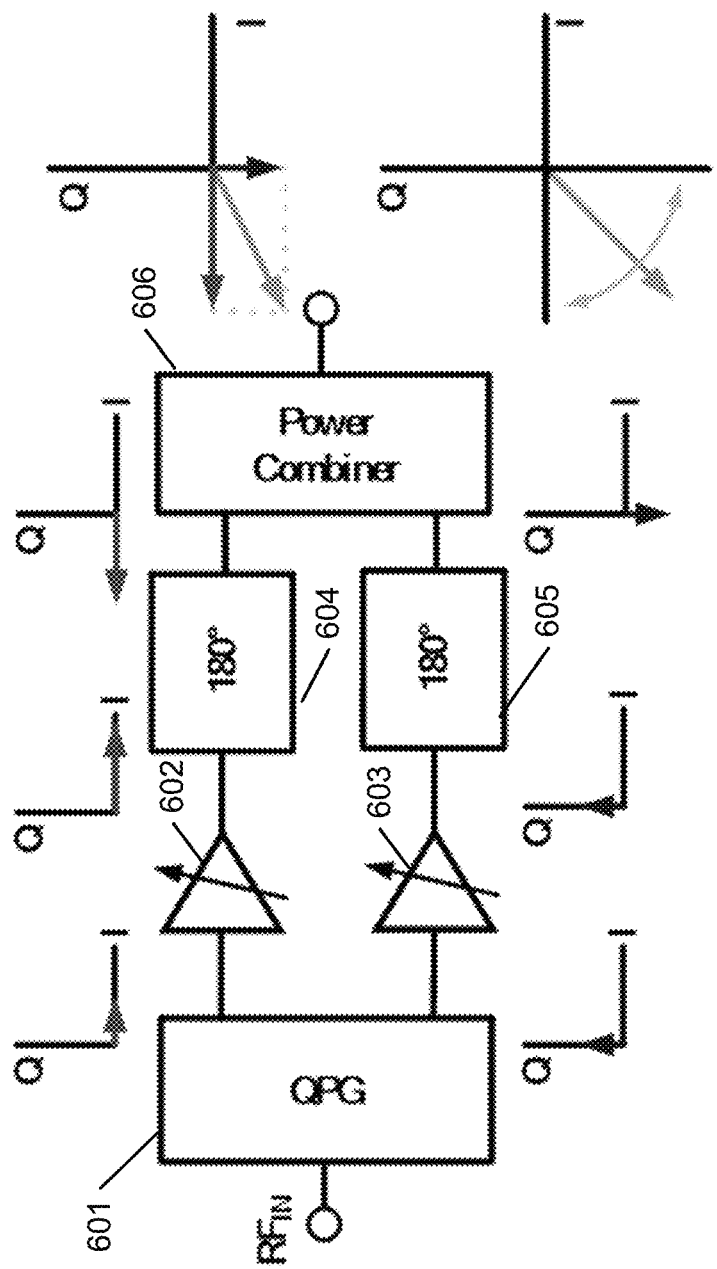

FIGS. 6A-6C are block diagrams illustrating a phase shifter circuit according to one embodiment of the invention. An example of a phase shifter circuit includes one or more variable gain amplifiers and one or more phase shifting logic. A variable gain amplifier (VGA) is coupled to the QPG circuit to amplify the signals with different gains. Phase shifting logic is coupled to the variable gain amplifier to switch in different degrees in phases to generate the quadrant signals. The QPG circuit generates a first signal shifted in a first degree (e.g., −45 degrees) and a second signal shifted in a second degree (e.g., +45 degrees).

In one embodiment, referring to FIG. 6A, phase shifter circuit 600 includes a QPG circuit 601, a first variable gain amplifier 602, a second variable gain amplifier 603, a first phase switch 604, a second phase switch 605, and a power combiner logic 606. The QPG circuit 601 is to generate a first signal shifted in a first degree (e.g., −45 degrees) and a second signal shifted in a second degree (e.g., +45 degrees). The first variable gain amplifier 602 is to amplify the first signal received from QPG circuit 601. The second variable gain amplifier 603 is to amplify the second signal generated from the QPG circuit. The first phase switch 604 and the second phase switch 605 are coupled to the first and second variable gain amplifiers 602-603 respectively. The power combiner logic 606 is coupled to the first phase switch 604 and the second phase switch 605 to combine outputs of the first and second phase switches 604-605 to generate the quadrant signals, which may be transmitted to transceivers such as transceivers 305A-305B of FIG. 3.

In one embodiment, each of the phase switches 604-605 can switch in a zero degree and 180 degrees when positioned in different positions (e.g., on or off position). When both the first and second phase switches are configured with zero degree, the quadrant signals generated are in the first quadrant space (e.g., between zero degree and 90 degrees), as shown in FIG. 6B. When the first phase switch is configured at the zero degree and the second phase switch is configured at the 180 degrees, the quadrant signals generated are in the second quadrant space (e.g., between 90 degrees and 180 degrees). When both the first and second phase switches are configured at 180 degrees, the quadrant signals generated are in the third quadrant space (e.g., between 180 degrees and 270 degrees), as shown in FIG. 6C. When the first phase switch is configured at 180 degrees and the second phase switch is configured at zero degree, the quadrant signals generated are the fourth quadrant space (e.g., between 270 degrees and 360 degrees). In one embodiment, by adjusting the gains of the variable gain amplifiers, an amplitude and phase angle of a corresponding quadrant signal can be adjusted within its corresponding quadrant space.

Figure 7:
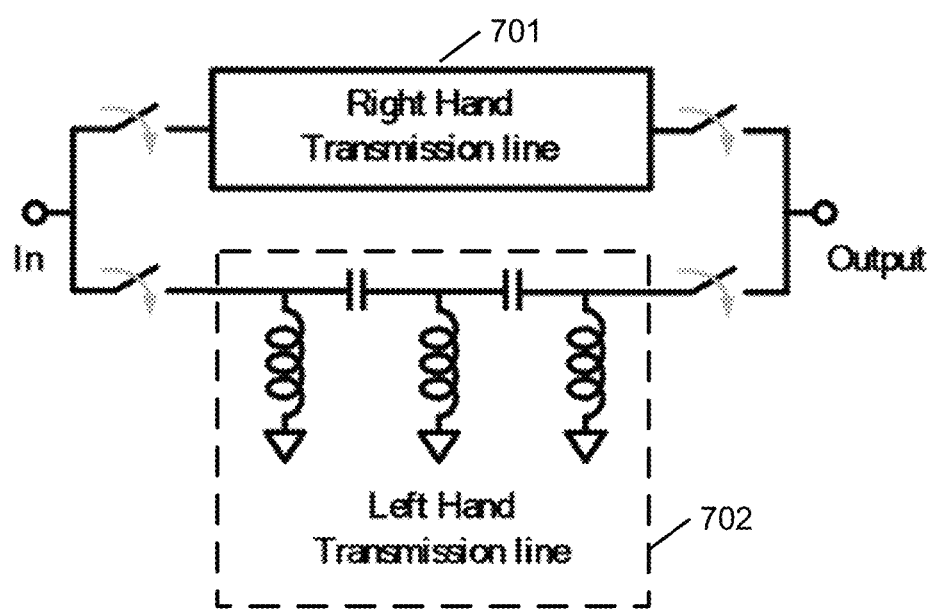
FIG. 7 shows an example of a phase switching logic according to one embodiment of the invention.

FIG. 7 is a block diagram illustrating an example of a phase switch circuit according to one embodiment. Phase switch circuit 700 may be implemented a part of phase switch circuit 604 or 605. Referring to FIG. 7, phase switch circuit 700 includes a first transmission line 701 as a right-hand transmission line and a second transmission line 702 as a left-hand transmission line. Each of the transmission lines 701-702 can be individually turned on or off via one or more selection logic. Although there is a pair of selection logic for each of the transmission lines, single selection logic may be enough to turn on or turn off the transmission line. In this example, only one of the transmission lines 701-702 may be turn on at any point in time. When transmission line 701 is turned on, the phases of the output and the input are identical (e.g., zero degree phase shift). When transmission line 702 is turned on, the phases of the input and output are 180 degrees in difference. In one embodiment, transmission line 701 may simply include a microstrip, while transmission line 702 includes one or more pair of inductive-capacitive (LC) circuit.

Figure 8:
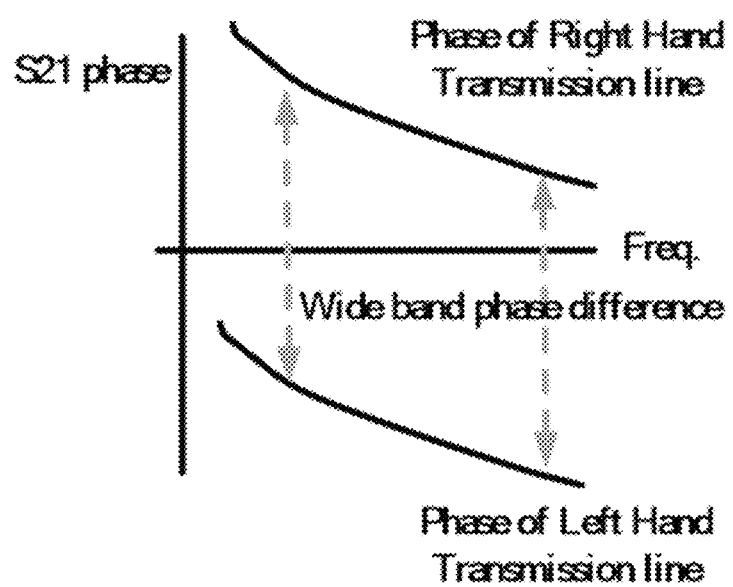
FIG. 8 shows a diagram of a response curve of a phase switching logic according to one embodiment of the invention.
Figure 9A:
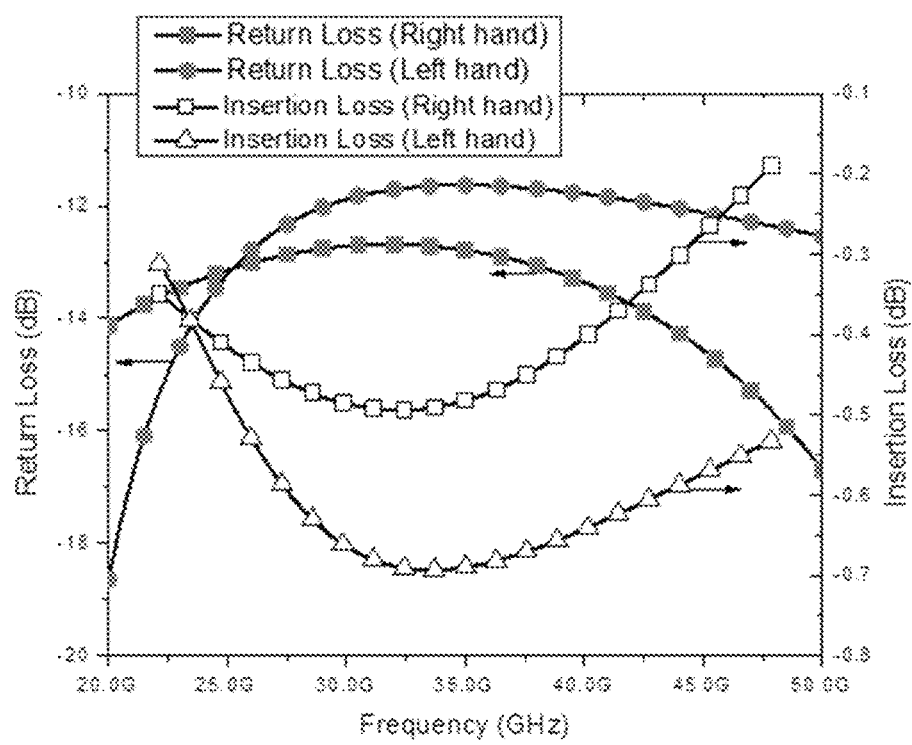
FIGS. 9A and 9B show performance curves according to some embodiments of the invention.
Figure 9B:
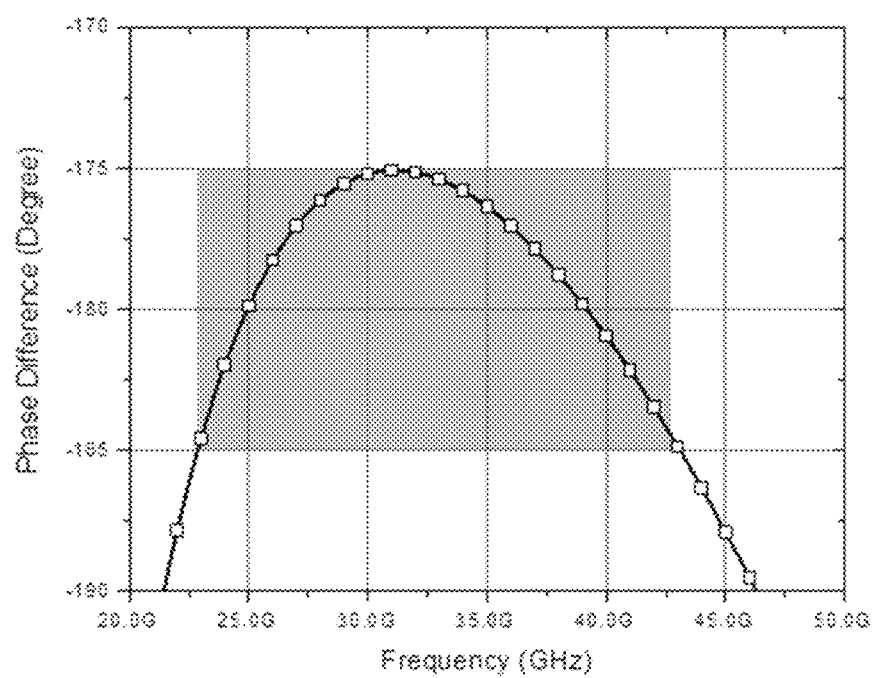
Figure 10:
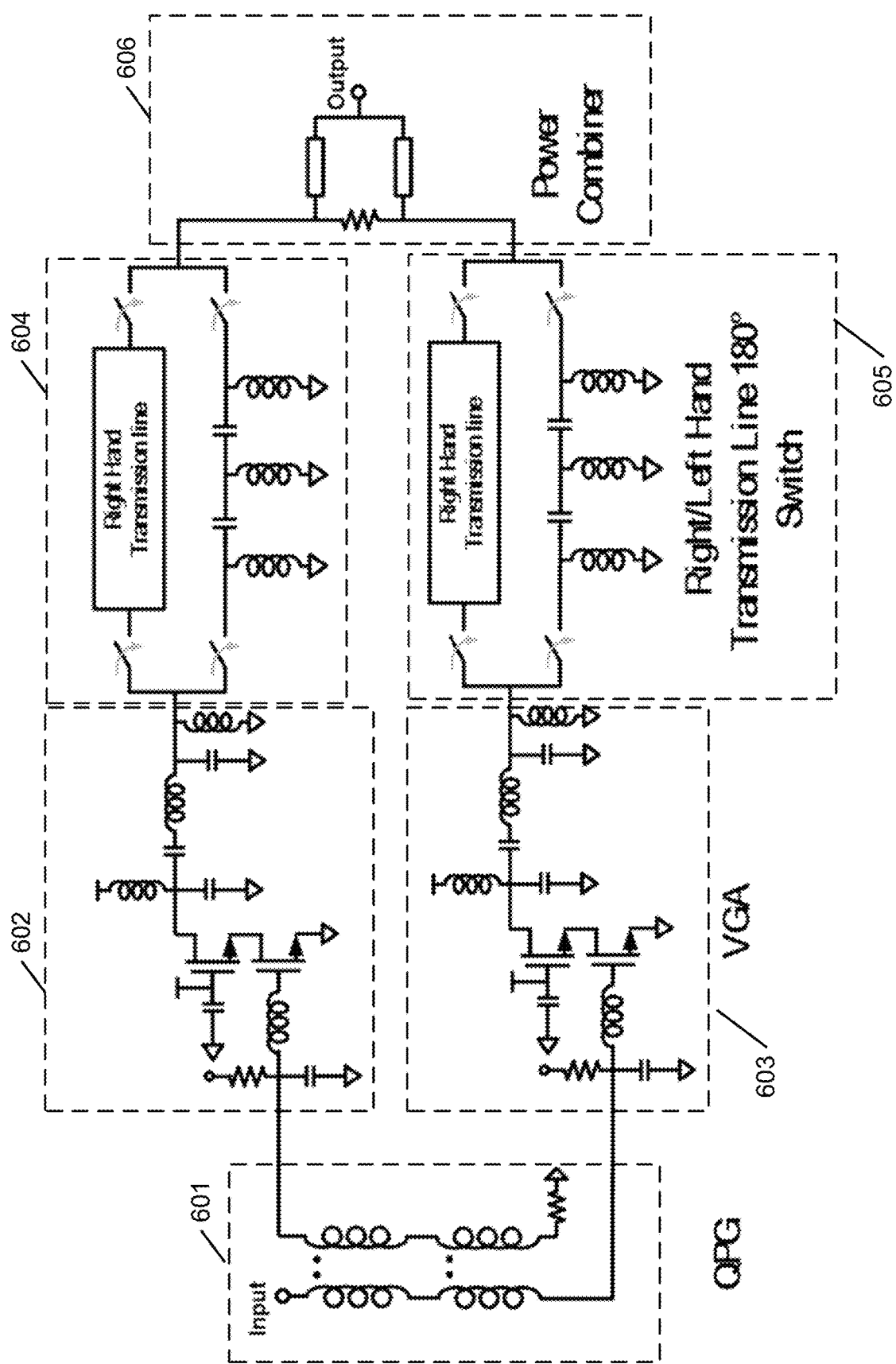
FIG. 10 shows a schematic diagram of a circuit according to one embodiment of the invention.

The S21 phase response from the right-hand and left-hand transmission lines are shown in FIG. 8, where the wide band phase difference can be obtained by subtracting two phase curves. The design results of right/left hand transmission line 180 degree switch are presented at FIG. 9A. Return losses are better than −10 dB, insertion losses difference is small than 0.3 dB. Phase difference from 23 to 43 GHz shows 180 degree with +/−5 degree variation which is suitable for 5G application as shown in FIG. 9B. FIG. 10 shows a schematic diagram illustrating an example of a specific implementation for the circuit as shown in FIGS. 6A-6C.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A radio frequency (RF) frontend integrated circuit (IC) device, comprising:
   an RF transceiver to transmit and receive RF signals within a predetermined frequency band; and
   a frequency synthesizer coupled to the RF transceiver to perform frequency synthetization in a wide frequency spectrum including the predetermined frequency band, wherein the frequency synthesizer generates a local oscillator (LO) signal to the RF transceiver to enable the RF transceiver to transmit and receive RF signals within the predetermined frequency band,
   wherein the frequency synthesizer comprises:
      a quadrature phase generator (QPG) circuit to generate a plurality of phase-shifted signals of the LO signal, and
      a phase shifting circuit coupled to the QPG circuit to generate a plurality of quadrant signals based on the phase-shifted signals of the LO signal, each of the quadrant signals corresponding to one of four quadrants in phases, wherein the phase shifting circuit comprises:
         a variable gain amplifier configured to first adjust a phase of the phase-shifted signals of the LO signal within one quadrant corresponding to a quadrant space of the phase-shifted signals of the LO signal; and
         a plurality of switches operable to collaboratively switch to further shift in phase the adjusted phase of the phase-shifted signals of the LO signal within the one quadrant to any of the four quadrants, wherein each of the switches comprises a right-hand transmission line and a left-hand transmission line that is individually configured in either an on or off state to shift in a zero degree or 180 degrees in phase.

2. The RF frontend IC device of claim 1, wherein:
   the variable gain amplifier coupled to the QPG circuit is configured to amplify the phase-shifted signals of the LO signal with a plurality of gains; and wherein the plurality of switches comprise
   a phase switch logic coupled to the variable gain amplifier to switch in a plurality of degrees in phases to generate the quadrant signals.

3. The RF frontend IC device of claim 2, wherein the QPG circuit generates a first signal shifted in a first degree and a second signal shifted in a second degree.

4. The RF frontend IC device of claim 3, wherein the first degree is −45 degrees and the second degree is +45 degrees shifted in phase.

5. The RF frontend IC device of claim 3, wherein the variable gain amplifier comprises a first variable gain amplifier and a second variable gain amplifier, wherein the first variable gain amplifier is coupled to the QPG circuit to receive and amplify the first signal, and wherein the second variable gain amplifier is coupled to the QPG circuit to receive and amplify the second signal.

6. The RF frontend IC device of claim 5, wherein the phase switch logic comprises a first phase switch and a second phase switch, wherein the first phase switch is coupled to the first variable gain amplifier, and wherein the second phase switch is coupled to the second variable gain amplifier.

7. The RF frontend IC device of claim 6, wherein the phase switch logic further comprises a power combiner logic coupled to the first phase switch and the second phase switch to combine outputs of the first phase switch and the second phase switch to generate the quadrant signals.

8. The RF frontend IC device of claim 6, wherein each of the first phase switch and the second phase switch can switch in a zero degree delay or a 180 degree delay in phase.

9. The RF frontend IC device of claim 8, wherein when the first phase switch is positioned with the zero degree and the second phase switch is positioned with the zero degree, the power combiner logic generate a first quadrant signal in a first quadrant space.

10. The RF frontend IC device of claim 9, wherein the first quadrant space is ranging from 0 to 90 degrees.

11. The RF frontend IC device of claim 9, wherein the first variable gain amplifier and the second variable gain amplifier are configured in different gains to adjust an amplitude and a phase angle of the first quadrant signal within the first quadrant space.

12. The RF frontend IC device of claim 8, wherein when the first phase switch is positioned with the zero degree and the second phase switch is positioned with the 180 degrees, the power combiner logic generate a second quadrant signal in a second quadrant space.

13. The RF frontend IC device of claim 12, wherein the second quadrant space is ranging from 90 to 180 degrees.

14. The RF frontend IC device of claim 12, wherein the first variable gain amplifier and the second variable gain amplifier are configured in different gains to adjust an amplitude and a phase angle of the second quadrant signal within the second quadrant space.

15. The RF frontend IC device of claim 8, wherein when the first phase switch is positioned with the 180 degrees and the second phase switch is positioned with the 180 degrees, the power combiner logic generate a third quadrant signal in a third quadrant space.

16. The RF frontend IC device of claim 15, wherein the third quadrant space is ranging from 180 to 270 degrees.

17. The RF frontend IC device of claim 15, wherein the first variable gain amplifier and the second variable gain amplifier are configured in different gains to adjust an amplitude and a phase angle of the third quadrant signal within the third quadrant space.

18. The RF frontend IC device of claim 8, wherein when the first phase switch is positioned with the 180 degrees and the second phase switch is positioned with the zero degree, the power combiner logic generate a fourth quadrant signal in a fourth quadrant space.

19. The RF frontend IC device of claim 18, wherein the fourth quadrant space is ranging from 270 to 360 degrees.

20. The RF frontend IC device of claim 18, wherein the first variable gain amplifier and the second variable gain amplifier are configured in different gains to adjust an amplitude and a phase angle of the fourth quadrant signal within the fourth quadrant space.

* * * * *